US011175342B2

(12) United States Patent
Nagano et al.

(10) Patent No.: US 11,175,342 B2
(45) Date of Patent: Nov. 16, 2021

(54) MONITORING DEVICE, MONITORING SYSTEM, AND MONITORING METHOD (71) Applicant: NEC Corporation, Tokyo (JP)

(72) Inventors: Hiroyuki Nagano, Tokyo (JP); Masataka Atsuki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 422 days.

(21) Appl. No.: 16/084,148

(22) PCT Filed: Mar. 14, 2017

(86) PCT No.: PCT/JP2017/010078
§ 371 (c)(1),
(2) Date: Sep. 11, 2018

(87) PCT Pub. No.: WO2017/163991
PCT Pub. Date: Sep. 28, 2017

(65) Prior Publication Data
US 2020/0292625 A1 Sep. 17, 2020

(30) Foreign Application Priority Data
Mar. 22, 2016 (JP) .............................. JP2016-057587

(51) Int. Cl.
G01R 31/3835 (2019.01)
G01R 31/396 (2019.01)
H01M 10/42 (2006.01)

(52) U.S. Cl.
CPC ....... *G01R 31/3835* (2019.01); *G01R 31/396* (2019.01); *H01M 10/425* (2013.01); *H01M 2010/4271* (2013.01)

(58) Field of Classification Search
None
See application file for complete search history.

(56) References Cited

U.S. PATENT DOCUMENTS 6,031,353 A * 2/2000 Banyas ............... H02J 7/00036
320/112
7,405,537 B2 * 7/2008 Hoffman .............. G01R 31/367
320/132

(Continued)

FOREIGN PATENT DOCUMENTS

JP 2009-301791 A 12/2009
JP 2012-208067 A 10/2012

(Continued)

OTHER PUBLICATIONS

International Search Report corresponding to PCT/JP2017/010078, 1 page, dated May 23, 2017.

(Continued)

Primary Examiner — Arleen M Vazquez
Assistant Examiner — Brandon J Becker (57) ABSTRACT In order to determine a monitoring circuit having a leak current equal to or more than a predetermined reference, the monitoring device 20 includes the determination unit 13 that determines whether a leak current of a specific monitoring circuit 11, among a plurality of monitoring circuits 11 that are driven using electric power stored in two or more battery units 10 associated as a monitoring target, is equal to or more than a first reference using: a comparison result of comparison between a proportion of the specific monitoring circuit 11 being associated with a low-voltage battery unit having the lowest voltage value among the plurality of battery units 10 and a predetermined threshold value; and information indicating whether or not the number of low-voltage battery units associated with the specific monitoring circuit 11 is 2 or more.

8 Claims, 8 Drawing Sheets

(56) References Cited

U.S. PATENT DOCUMENTS

| | | | |
|---|---|---|---|
| 7,800,247 B2* | 9/2010 | Chang | H02J 3/32 |
| | | | 307/46 |
| 8,259,221 B1* | 9/2012 | Kaplan | H02J 7/00309 |
| | | | 348/372 |
| 2012/0032648 A1* | 2/2012 | Ghantous | G01R 31/388 |
| | | | 320/139 |
| 2012/0235483 A1* | 9/2012 | Rigby | H01M 10/633 |
| | | | 307/29 |
| 2012/0253716 A1 | 10/2012 | Tsuchiya et al. | |
| 2013/0274972 A1* | 10/2013 | Kusumi | B60L 58/13 |
| | | | 701/22 |
| 2013/0335095 A1 | 12/2013 | Kiuchi | |
| 2014/0285156 A1* | 9/2014 | Mukaitani | H02J 7/0021 |
| | | | 320/134 |
| 2015/0280480 A1* | 10/2015 | Mitri | G01R 27/08 |
| | | | 307/22 |
| 2016/0211679 A1* | 7/2016 | Rabbers | H01M 10/46 |
| 2016/0226284 A1* | 8/2016 | Spesser | H02J 7/0045 |
| 2016/0233700 A1* | 8/2016 | Muto | B60L 58/14 |
| 2016/0336623 A1* | 11/2016 | Nayar | H01M 4/44 |
| 2017/0057372 A1* | 3/2017 | Loftus | G01R 31/396 |
| 2018/0217206 A1 | 8/2018 | Kiuchi | |

FOREIGN PATENT DOCUMENTS

| | | |
|---|---|---|
| JP | 2013-094032 A | 5/2013 |
| JP | 2014-223003 A | 11/2014 |

OTHER PUBLICATIONS

Written Opinion of International Search Authority corresponding to PCT/JP2017/010078, 4 pages, dated May 23, 2017.

Extended European Search Report issued in European Patent Application No. 17770034.1, dated Mar. 6, 2019, 7 pages.

* cited by examiner

| SAMPLE NO. | LOW-VOLTAGE BATTERY UNIT |
|---|---|
| 1 | BATTERY UNIT 10a |
| 2 | BATTERY UNIT 10a |
| 3 | BATTERY UNIT 10c |
| 4 | BATTERY UNIT 10d |
| 5 | BATTERY UNIT 10b |
| 6 | BATTERY UNIT 10c |
| 7 | BATTERY UNIT 10a |
| 8 | BATTERY UNIT 10f |
| 9 | BATTERY UNIT 10b |
| 10 | BATTERY UNIT 10c |

MONITORING DEVICE, MONITORING SYSTEM, AND MONITORING METHOD

CROSS-REFERENCE TO RELATED APPLICATIONS

This application is a national stage application of International Application No. PCT/JP2017/010078 entitled "MONITORING DEVICE, MONITORING SYSTEM, AND MONITORING METHOD," filed on Mar. 14, 2017, which claims the benefit of the priority of Japanese Patent Application No. JP2016-057587 filed on Mar. 22, 2016, the disclosures of each of which are hereby incorporated by reference in their entirety.

TECHNICAL FIELD

The present invention relates to a monitoring device, a monitoring system and a monitoring method.

BACKGROUND ART

In a power storage system using a plurality of secondary batteries, monitoring is conducted in order to perform maintenance needed when a battery has degraded with time, and when abnormality has occurred. For example, there is disclosed in patent literature 1 a fault diagnosis apparatus which compares a threshold value that corresponds to an average voltage value of batteries in a power storage system with the voltage value of each battery to detect abnormality of a battery based on a result of the comparison.

CITATION LIST

Patent Literature

[PTL 1] Japanese Patent Application Laid-Open No. 2009-301791

SUMMARY OF INVENTION

Technical Problem

However, a change in a voltage value is not always caused by abnormality of a battery. For example, in a case where monitoring circuits which monitor the voltage values of batteries are driven using the electric power stored in batteries of their own monitoring targets, if there exists a monitoring circuit having a large leak current (a large self-current-consumption), the voltage values of batteries associated with the monitoring circuit in question decline. However, in a fault diagnosis apparatus described in patent literature 1, there are cases where determination that a battery is abnormal is made in spite of abnormality of the battery having not occurred in reality. If it is abnormality of a monitoring circuit, there is a risk that monitoring of such as a voltage value becomes unavailable eventually. Furthermore, appropriate maintenance work will not be able to be conducted.

Accordingly, an object of the present invention is to provide a monitoring device, a monitoring system and a monitoring method which settle the issue mentioned above.

Solution to Problem

A monitoring device according to the present invention includes a determination unit to determine whether a leak current of a specific monitoring circuit among a plurality of monitoring circuits driven using electric power stored in two or more battery units associated as a monitoring target is equal to or more than a first reference using a comparison result of comparison between a proportion of the specific monitoring circuit being associated with a low-voltage battery unit having a lowest voltage value among the plurality of battery units in a predetermined period and a predetermined threshold value; and information indicating whether a number of low-voltage battery units associated with the specific monitoring circuit is two or more.

The monitoring system according to the present invention includes a plurality of battery units capable of being charged and discharged, a plurality of monitoring circuits, driven using electric power stored in two or more battery units associated as a monitoring target among the plurality of battery units, to monitor voltage values of the associated battery units, a detection unit to detect a low-voltage battery unit having a lowest voltage value among the plurality of battery units, and a determination unit to determine whether a leak current of a specific monitoring circuit among the plurality of monitoring circuits is equal to or more than a first reference using: a comparison result of comparison between a proportion of the specific monitoring circuit being associated with a battery unit detected as the low-voltage battery unit in a predetermined period and a first threshold value; and information indicating whether a number of low-voltage battery units associated with the specific monitoring circuit is two or more.

A monitoring method according to the present invention is a monitoring method in a monitoring system including a plurality of battery units capable of being charged and discharged, and a plurality of monitoring circuits, driven using electric power stored in two or more battery units associated as a monitoring target among the plurality of battery units, to monitor voltage values of the associated battery units, the monitoring method including acquiring information on a low-voltage battery unit having a lowest voltage value among the plurality of battery units, in a predetermined period, calculating a proportion of a specific monitoring circuit, among the plurality of monitoring circuits, being associated with a battery unit having been detected as the low-voltage battery unit, and determining whether a leak current of the specific monitoring circuit is equal to or more than a first reference using a comparison result between the proportion and a predetermined threshold value and information indicating whether a number of low-voltage battery units associated with the specific monitoring means is two or more.

Advantageous Effects of Invention

According to the present invention, it is possible to determine a monitoring circuit having a leak current equal to or more than a predetermined reference.

EXAMPLE EMBODIMENT

Hereinafter, example embodiments of the present invention will be described with reference to accompanying drawings. Note that, in the present description and drawings, overlapped description may be omitted by attaching identical codes to components having identical functions.

In the present description and drawings, a plurality of components having a substantially identical function may be classified by attaching different alphabets after an identical code. For example, a plurality of structures having a substantially identical functional constitution are classified like a battery unit 10a and a battery unit 10b according to the need. However, when each of these components does not need to be classified in particular, only an identical code is given. For example, when a battery unit 10a and a battery unit 10b do not need to be classified in particular, the battery units are just called the battery units 10.

The First Example Embodiment (Functional Configuration of the Monitoring System 100)

Figure 1:
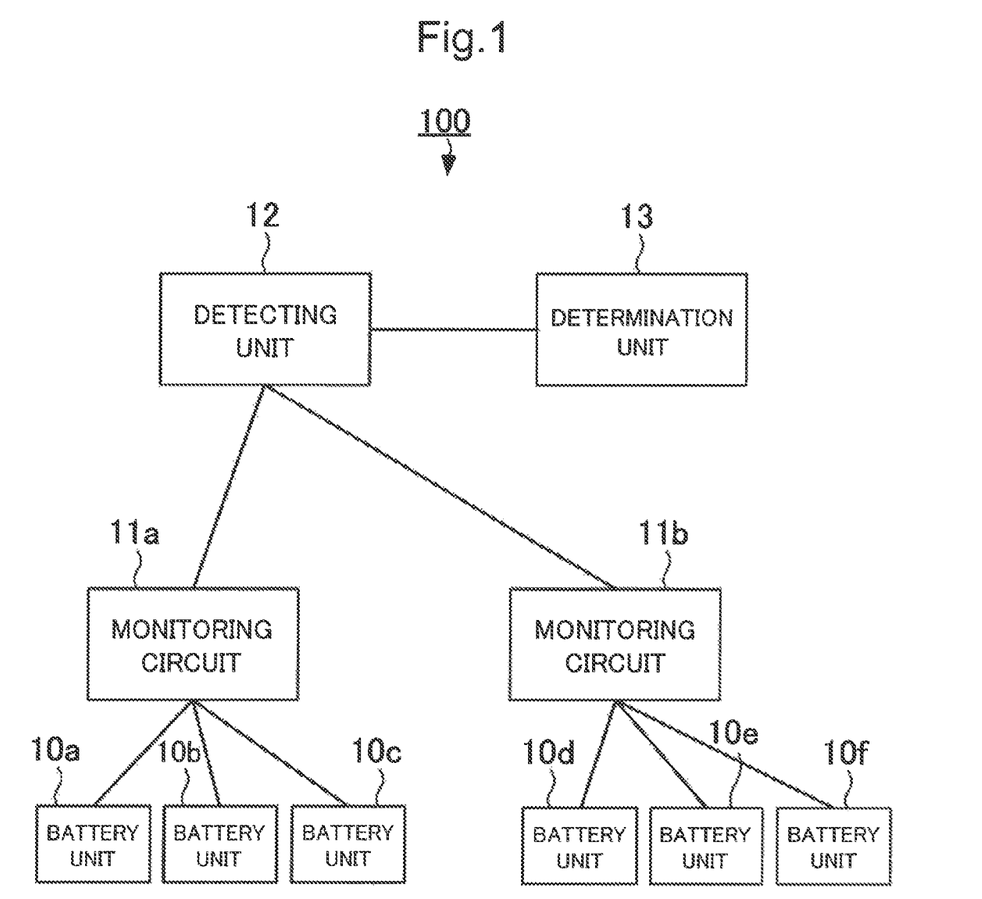
FIG. 1 indicates an example functional configuration of a monitoring system 100 according to an example embodiment of the present invention.

FIG. 1 indicates an example functional configuration of a monitoring system according to an example embodiment of the present invention. This monitoring system 100 includes a plurality of battery units 10a-10f, a plurality of monitoring circuits 11a and 11b, a detecting unit 12, and the determination unit 13. The battery units 10 are battery cells, or battery modules or a battery packs including a plurality of battery cells. Each of the monitoring circuits 11, with which part of the plurality of battery units 10 are associated as monitoring targets, acquires voltage values of battery units 10 of its own monitoring targets. Specifically, the monitoring circuit 11a is associated with the battery units 10a-10c, and the monitoring circuit 11b is associated with the battery units 10d-10f. Each of the monitoring circuits 11 is driven using the electric power stored in battery units 10 of its own monitoring targets. The detecting unit 12 acquires from the monitoring circuits 11 information on voltage values monitored by the plurality of monitoring circuits 11, and detects specific information from the acquired information. For example, the detecting unit 12 detects a low-voltage battery unit that indicates the lowest voltage value among the battery units 10a-10f based on the acquired voltage values. The determination unit 13 determines a state of the monitoring system 100 based on the information detected by the detecting unit. For example, based on information on a low-voltage battery unit and a corresponding relationship between the monitoring circuits 11 and the battery units 10, and by comparison with the other monitoring circuits 11, the determination unit 13 can determine a monitoring circuit 11 having a leak current equal to or more than a predetermined reference. The monitoring circuits 11, the detecting unit 12 and the determination unit 13 may be of structures and functions to be mounted on a BMU (Battery Management Unit), for example.

In FIG. 1, an example of the monitoring system 100 having two monitoring circuits 11 and six battery units 10 has been described for simplification. However, the present invention is not limited to this example. The number of the battery units 10 and the number of the monitoring circuits 11 are just illustration, and a monitoring system should just be of a structure in which each of no smaller than two monitoring circuits 11 monitors no smaller than two battery units 10. The battery units 10 are connected to electrical loads, power generation facilities and the like which are not being illustrated, and constitute a power storage system.

(Observation Examples of Voltage Values)

Figure 2:
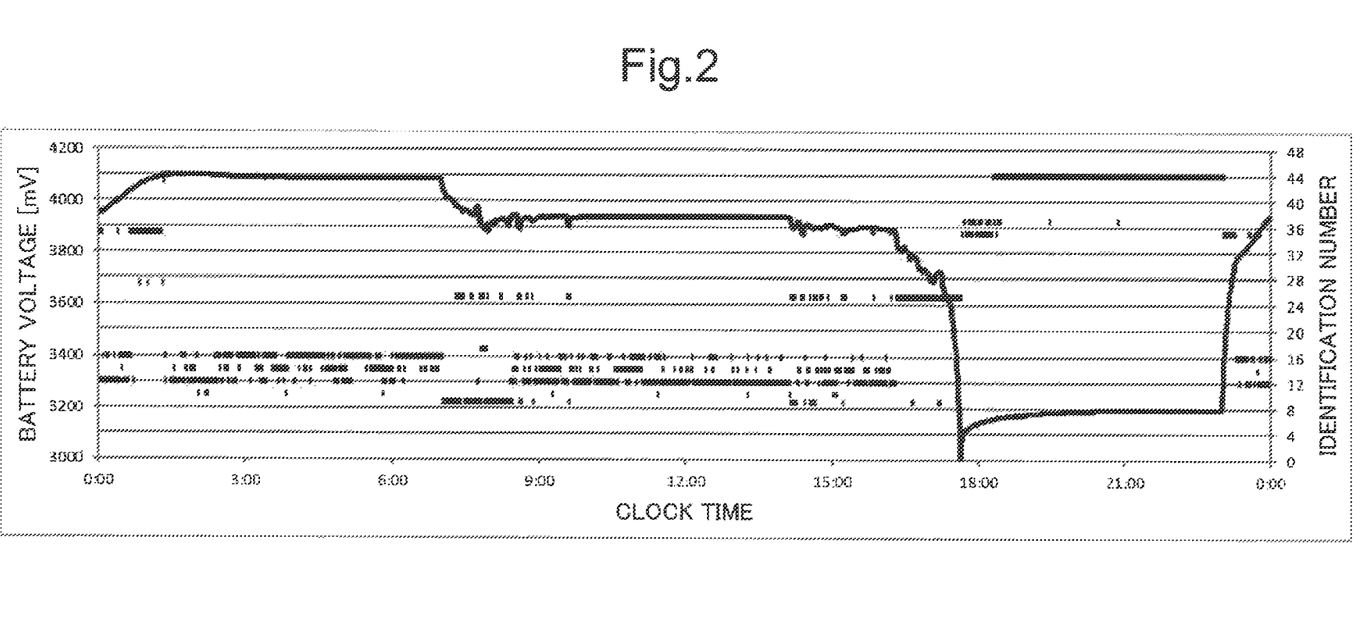
FIG. 2 is a diagram illustrating an example (normal case) of a temporal change between a minimum voltage value observed in the monitoring system 100 and the identification number of a battery unit 10 which has indicated the minimum voltage value.
Figure 3:
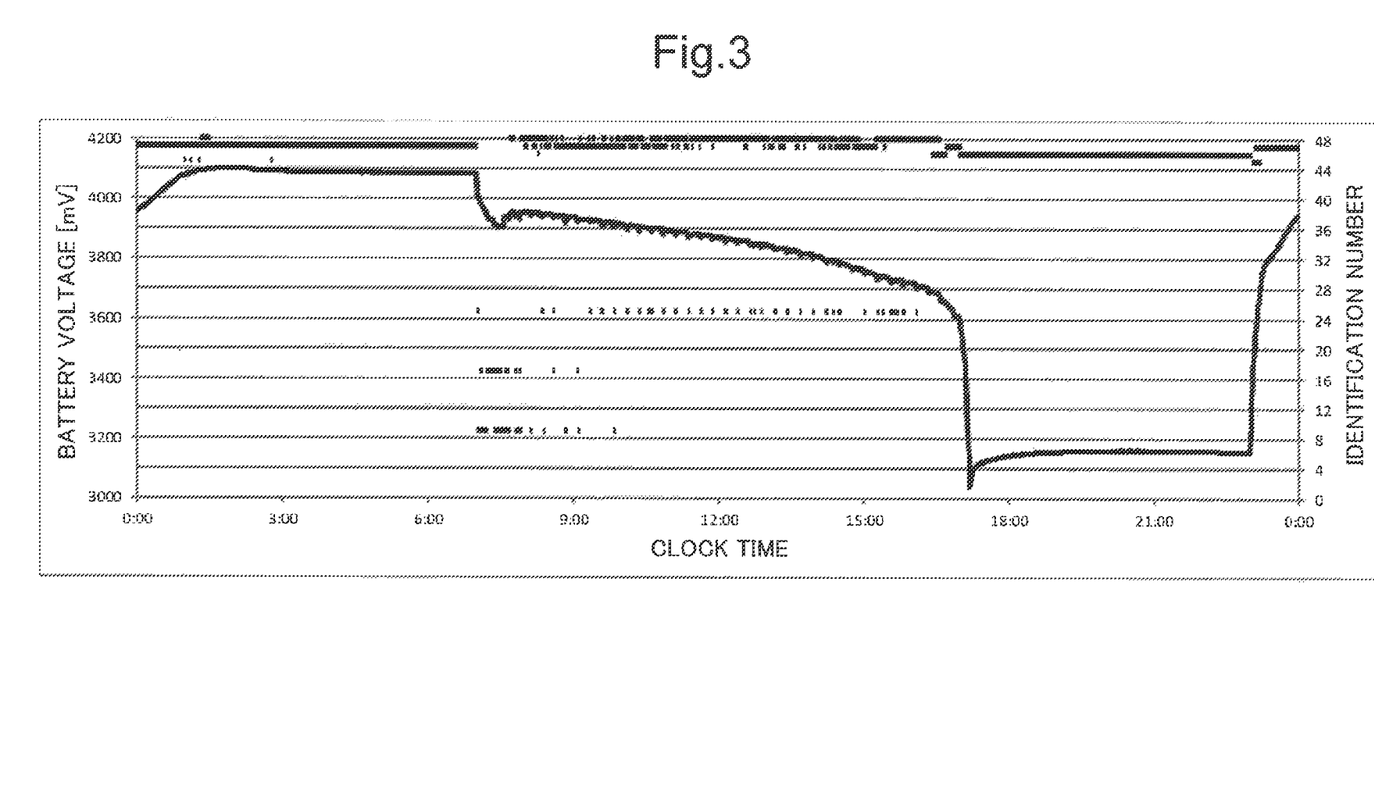
FIG. 3 is a diagram illustrating another example (abnormal case) of a temporal change between a minimum voltage value observed in the monitoring system 100 and the identification number of a battery unit 10 which has indicated the minimum voltage value.

FIG. 2 and FIG. 3 are graphs illustrating a temporal change in a minimum voltage value observed in the monitoring system 100, which has 12 monitoring circuits 11 and 48 battery units 10, and the identification numbers of the battery units 10 that have indicated minimum voltage values. The horizontal axis of FIG. 2 and FIG. 3 is clock time, and the vertical axis in the left end is a battery voltage, and the vertical axis in the right end is the identification numbers of the battery units 10. The 48 battery units 10 are respectively identified by the numbers 1-48, and battery units 10 that are identified by four continuous numbers are associated with one monitoring circuit 11 in common. Specifically, the battery numbers of the battery units 10 are divided into 12 groups of 1-4, 5-8, 9-12 . . . 41-44, and 45-48, and battery units 10 in an identical group are monitored by an identical monitoring circuit 11.

The monitoring circuits 11 have different leak currents individually. When a monitoring circuit 11 having a large leak current is used though the monitoring circuit is not in a level of a defective product, electric power stored in a battery unit 10 is consumed accordingly. For this reason, the larger the leak current of a monitoring circuit 11 is, the larger a decreased amount of the voltage of a battery unit 10 associated as a monitoring target. When it cannot be determined that the cause of such decrease exists in the monitoring circuit 11, there may be a case where it is determined that the decrease has been caused by abnormality of the battery unit 10 though abnormality has not occurred in the battery unit 10 actually, and a case where the system is stopped. For this reason, a method to determine a monitoring circuit 11 having a leak current equal to or more than a reference is provided here.

In the example of FIG. 2, low-voltage battery units are distributed in battery units 10 of various identification numbers without concentrating on specific battery units 10. Specifically, in the example of FIG. 2, it can be found that low-voltage battery units are distributed among the battery units 10 of identification numbers 9-16 from time 0:00 to 17:00, and, in the other time band, low-voltage battery units are distributed among the other battery units 10. That is, it can be seen that low-voltage battery units are distributed among battery units 10 that are associated with different monitoring circuits 11. In contrast, in the example of FIG. 3, low-voltage battery units concentrate on the battery units 10 of the identification numbers 45-48. These battery units 10 are associated with an identical monitoring circuit 11. Usually, charge or discharge is performed in such a way that voltages of a plurality of battery units 10 may become uniform, and, when there is caused a difference in the voltages, a corrective action (balance operation) to make the voltage difference be small is performed. Therefore, when low-voltage battery units concentrate on specific battery units 10, there is a high possibility of occurrence of some abnormality. When abnormality occurs in a battery unit 10 itself, a possibility that abnormality simultaneously occurs in a plurality of battery units 10 is low, and, therefore, it can be thought that low-voltage battery units concentrate on one battery unit 10 that has the abnormality. Regarding low-voltage battery units, when the low-voltage battery units are distributed among a plurality of battery units 10 as with the example indicated in FIG. 2, it is thinkable that abnormality does not exist in the battery units 10 and the power storage system. In contrast, when low-voltage battery units concentrate on a plurality (at least 2 or more) of battery units 10 which are monitored by a specific monitoring circuit 11 like the example indicated in FIG. 3, it can be thought that the leak current of the specific monitoring circuit 11 is large. For this reason, it can be thought that the leak current of a specific monitoring circuit 11 is large when a proportion of the specific monitoring circuit 11 having been associated with low-voltage battery units is no smaller than a predetermined threshold value and, in addition, there are no smaller than two low-voltage battery units associated with the specific monitoring circuit 11. Using such feature, a monitoring circuit 11 whose leak current is larger than a predetermined reference can be detected by performing comparison with other monitoring circuits 11 using information on low-voltage battery units and the corresponding relationship between the battery units 10 and the monitoring circuits 11. In any of FIG. 2 and FIG. 3, in a period without a change in a battery voltage, which is considered to be a waiting period during which the battery units 10 are neither charged nor discharged, it can be found that there is a little substitution of low-voltage battery units. For this reason, it is more preferable that a period during which determination of the above-mentioned feature be a period when the battery units 10 is being charged, discharged, or charged and discharged.

(Example of Operations of the Determination unit 13)

Figure 4:
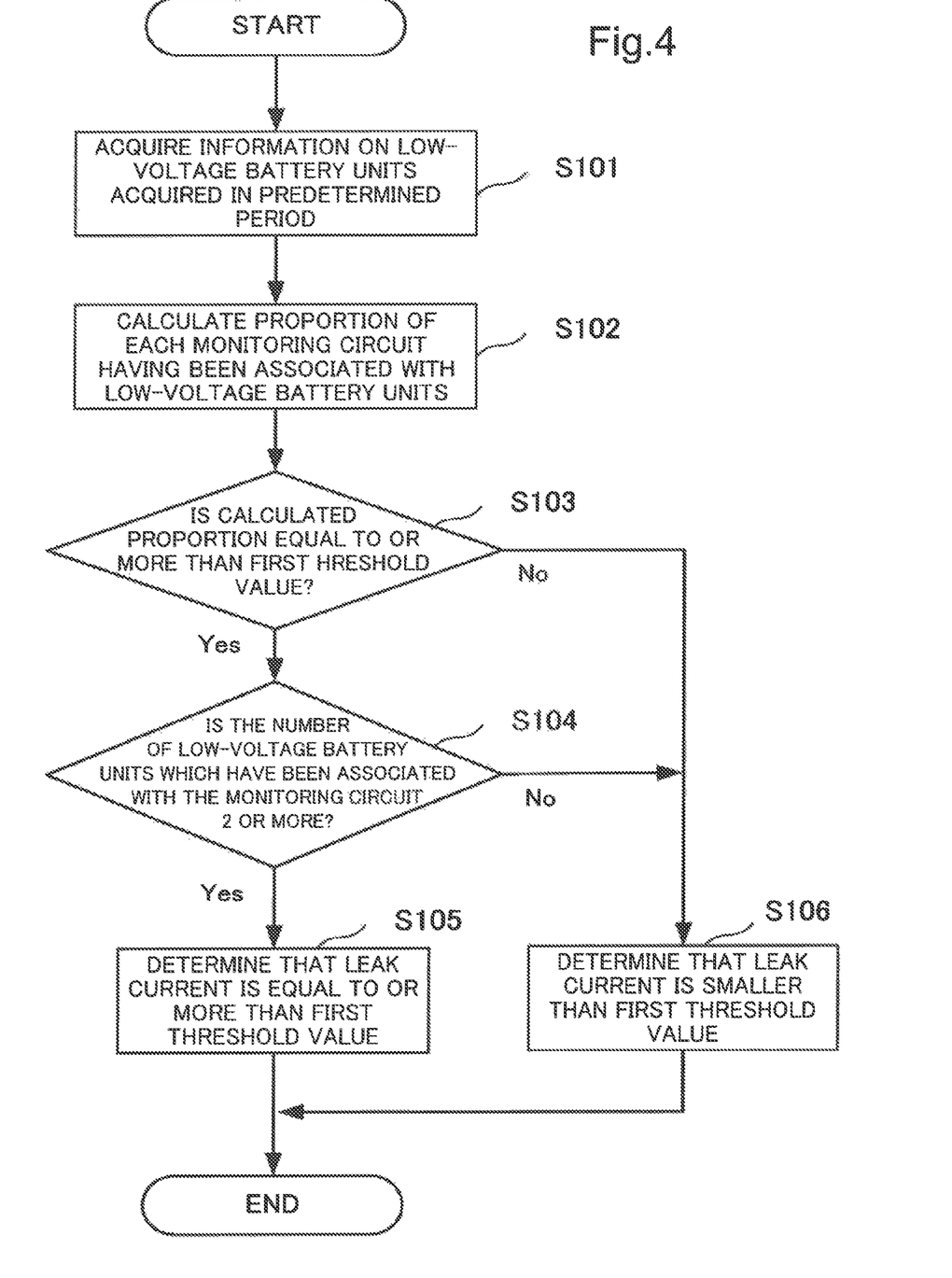
FIG. 4 is a flow chart illustrating an example of operations of a determination unit 13 of the monitoring system 100 according to a first example embodiment of the present invention.

FIG. 4 is a flow chart illustrating an example of operations of the determination unit 13 of the monitoring system 100 according to the first example embodiment of the present invention. The determination unit 13 acquires from the detecting unit 12 information on low-voltage battery units acquired in a predetermined period. The longer a period used here is, the higher the determination accuracy is. For example, the determination unit 13 may perform determination from information in a period of one cycle starting from a state of full charge until the battery units 10 is completely discharged. The determination unit 13 may perform determination from information in a period during which the battery units 10 are being charged and discharged. The determination unit 13 may perform determination from information in a period during which the battery units 10 are being charged in particular. Here, the reason why it is better to perform determination from information in a period during which the battery units 10 is being charged will be described. When there is a cell which has deteriorated, there is a tendency that the resistance becomes large at the time of charging, causing a higher voltage. Therefore, when low-voltage battery units concentrate on battery units associated with an identical monitoring circuit 11 also at the time of charging, it is thinkable that the self-current-consumption of the monitoring circuit is large. In addition, if abnormality is not occurring in the monitoring circuits 11, there is a high possibility that low-voltage battery units substitute when the battery units 10 are charged and discharged, and, therefore, it is desirable that the predetermined period include a period during which charge and discharge is performed (Step S101).

Using the acquired information on low-voltage battery units and the information indicating a corresponding relationship between the battery units 10 and the monitoring circuits 11, the determination unit 13 calculates a proportion of each monitoring circuit 11 having been associated with low-voltage battery units. The proportion may be a proportion of a time period during which each monitoring circuit 11 has been associated with low-voltage battery units within a predetermined period. Furthermore, the proportion may be a proportion of a corresponding relationship between each monitoring circuit 11 and low-voltage battery units acquired in a predetermined time interval. In that case, it is better to acquire, in a period during which the battery units 10 are charged, discharged, or charged and discharged, information at ten time points in a predetermined time interval, and calculate a proportion of each monitoring circuit 11 having been associated with low-voltage battery units in the 10 time points. For example, when the battery units 10 are charged in 1 C (charge will be completed in one hour from a state of complete discharge), a corresponding relationship between each monitoring circuit 11 and low-voltage battery units is acquired at every 6 minutes interval, and then a proportion of each monitoring circuit 11 is calculated. A corresponding relationship between the battery units 10 and the monitoring circuits 11 is stored in a memory unit which is not illustrated, and the determination unit 13 acquires information on the corresponding relationship from the memory unit.

Figure 5:
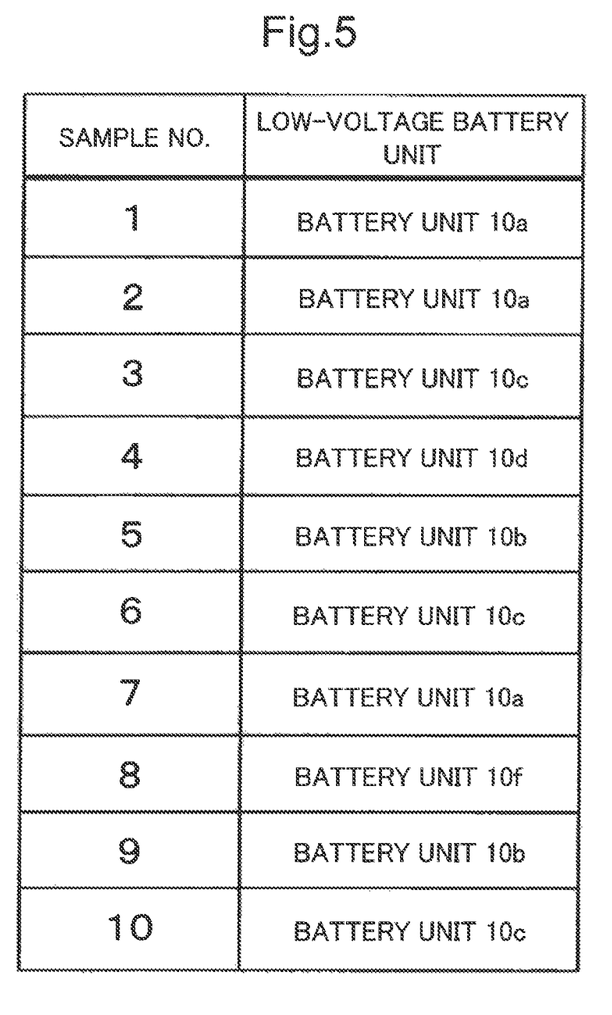
FIG. 5 is a diagram for describing a specific example of Step S102 of FIG. 3.

FIG. 5 is a diagram for describing a specific example of Step S102 of FIG. 4. For simplicity, FIG. 5 indicates a sample in which a low-voltage battery unit is detected ten times in the monitoring system 100 of the structure illustrated in FIG. 1. In this example, battery units 10a, 10b and 10c are associated with the monitoring circuit 11a, and battery units 10d, 10e and 10f are associated with the monitoring circuit 11b. Accordingly, in a period in which the samples No. 1-10 have been acquired, the proportion of the monitoring circuit 11a having been associated with low-voltage battery units is 80%, and the proportion of the monitoring circuit 11b having been associated with low-voltage battery units is 20%.

Description will be returned to FIG. 4. The determination unit 13 compares a calculated proportion and the magnitude of a first predetermined threshold value, and determines whether the calculated proportion is equal to or more than the first predetermined threshold value. The first threshold value that the determination unit 13 uses here is determined according to the system configuration of the monitoring system 100 and the length of a target period. For example, the larger the number of the monitoring circuits 11 is, the smaller the numerical value of the first threshold value may be. The shorter the predetermined period is, the larger the numerical value of the first threshold value may be. The first threshold value is a numerical value for determining that low-voltage battery units are biased to battery units 10 associated with a specific monitoring circuit 11, and is 80%, for example. The determination unit 13 compares the largest numerical value among the proportions calculated in Step S102 with the first threshold value (Step S103).

When the calculated proportion is no smaller than the first predetermined threshold value, the determination unit 13 determines whether the number of low-voltage battery units which have been associated with the monitoring circuit 11 having the highest calculated proportion is 2 or more (Step S104). When the number of the low-voltage battery units associated with the monitoring circuit 11 is 2 or more, the determination unit 13 determines that the leak current of the monitoring circuit 11 in question is equal to or more than the first reference (Step S105).

When the calculated proportion is smaller than the first predetermined threshold value, or when the number of low-voltage battery units associated with the monitoring circuit is 1, the determination unit 13 determines that the leak current of the monitoring circuit 11 is smaller than the first reference (Step S106).

The operations indicated in FIG. 4 may be carried out periodically, for example, and may be carried out when predetermined starting operation has been performed. The state to be detected by the above-mentioned procedure is a state that the leak current of a specific monitoring circuit 11 is large compared with the other monitoring circuits 11, and the electric power of battery units 10 of the monitoring target of the specific monitoring circuit 11 has been consumed in a biased manner due to the influence of the leak current. For this reason, even when the leak current of a monitoring circuit 11 is equal to or more than a predetermined reference, there is also a case where influence on an operation itself of a power storage system is small, and thus it cannot be said to be an abnormal state. For this reason, when the determination unit 13 determines that the leak current of a specific monitoring circuit 11 is equal to or more than a reference, the monitoring system 100 may notify, according to how the first threshold value has been set, of the determination as reference information for identifying the cause of the voltage reduction. Alternatively, according to how the first threshold value has been set, the monitoring system 100 can notify, when the determination unit 13 determines that the leak current of a specific monitoring circuit 11 is equal to or more than a reference, an administrator and the like of the monitoring system 100 of such determination as abnormality of the system.

As it has been described above, according to this example embodiment, a plurality of monitoring circuits 11 of the monitoring system 100 are driven using the electric power stored in the battery units 10 associated with each of the monitoring circuits 11 as a monitoring target. Then, a proportion of a specific monitoring circuit 11, among a plurality of monitoring circuits 11, having been associated with low-voltage battery units is compared with the first predetermined threshold value. Using the result of the comparison and information which indicates whether there are two or more low-voltage battery units that have been associated with the specific monitoring circuit 11, determination whether the leak current of the specific monitoring circuit 11 is equal to or more than the first predetermined reference is made. By this structure, it is possible to identify a monitoring circuit 11 having a large leak current compared with the other monitoring circuits 11. For this reason, it becomes possible to identify that, when the voltage of a battery unit 10 has declined due to a large leak current of a monitoring circuit 11 in spite of abnormality having not occurred in the battery unit 10, the cause of the voltage reduction is in the monitoring circuit 11. Accordingly, in the monitoring system 100, misdetection of abnormality of the battery units 10 can be suppressed.

Also, according to this example embodiment, different numerical values are employed as the first threshold value according to a length of the predetermined period. Specifically, the shorter the predetermined period is, the larger the first threshold value to be used is. By this structure, it is possible to improve accuracy of determining a monitoring circuit 11 having a large a leak current.

According to this example embodiment, it is possible to use, as the predetermined period, a period during which the battery units 10 are being charged, discharged, or charged and discharged. Compared with a waiting period, in a period during which the battery units 10 is being charged, discharged, or charged and discharged, the feature that is seen when a monitoring circuit 11 having a large leak current is included tends to appear in a voltage value. Therefore, it is possible to improve determination accuracy of a monitoring circuit 11 having a large leak current.

The Second Example Embodiment

Description of the functional configuration of the monitoring system 100 according to the second example embodiment of the present invention will be omitted here because it is identical with that of the first example embodiment. In this example embodiment, operations of the detecting unit 12 and the determination unit 13 are different from those of the first example embodiment, and thus the different points will be described mainly.

(Example of Operations of the Determination Unit 13)

Figure 6:
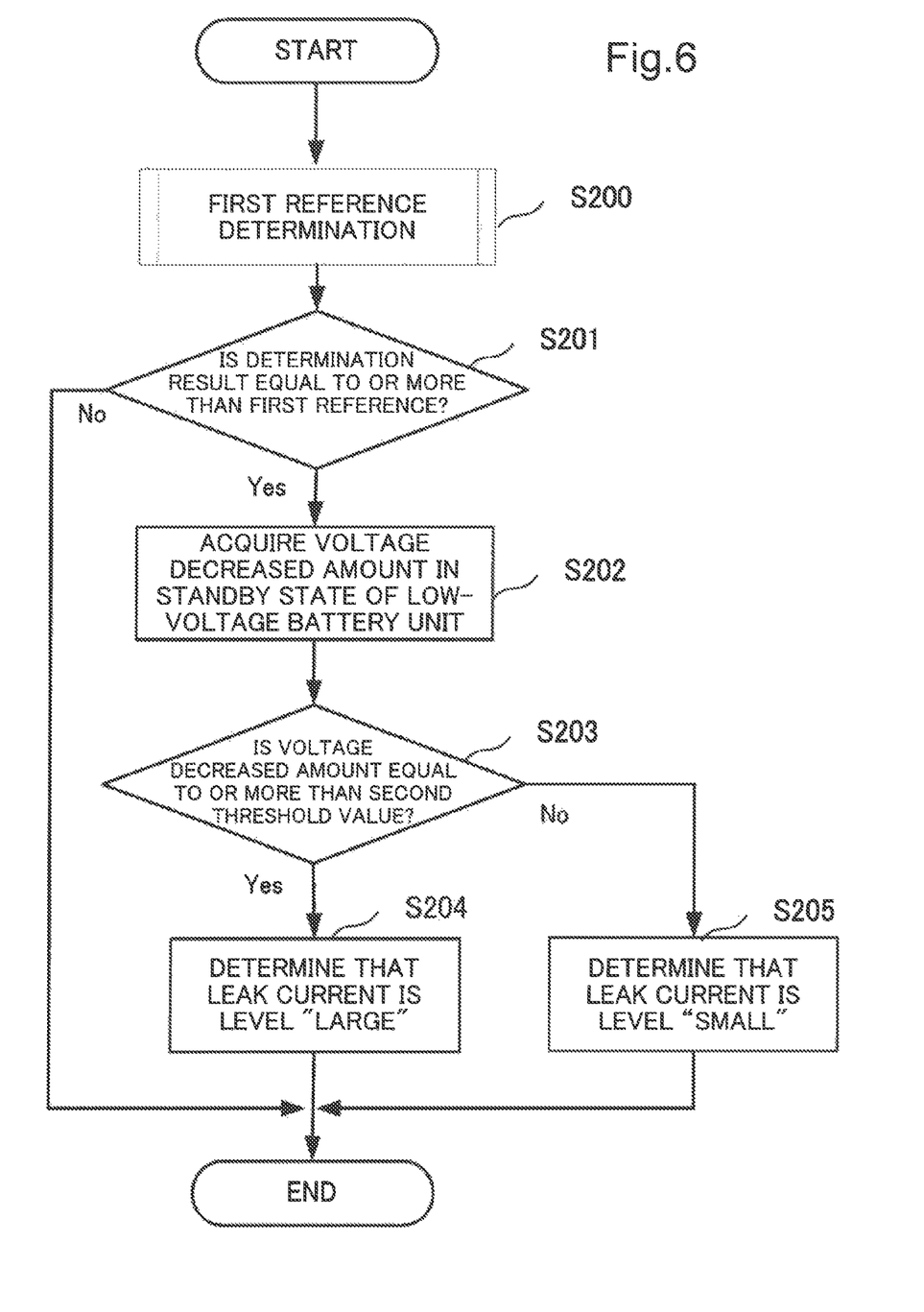
FIG. 6 is a flow chart illustrating an example of operations of the determination unit 13 of the monitoring system 100 according to a second example embodiment of the present invention.

FIG. 6 is a flow chart for describing an example of operations of the determination unit 13 of the monitoring system 100 according to the second example embodiment of the present invention. The determination unit 13 performs a first reference determination (Step S200). The first reference determination indicated in Step S200 corresponds to Steps S101-S106 of FIG. 4. The determination unit 13 performs the first reference determination and determines whether the determination result is equal to or more than the first reference (Step S201). When the determination result is equal to or more than the first reference, the determination unit 13 acquires from the detecting unit 12 a voltage decreased amount in a standby state of the low-voltage battery unit (Step S202).

Step S201 will be described in detail. First, in the standby state (a state in which neither charge nor discharge is being performed), the detecting unit 12 detects a voltage decreased amount of each of the battery units 10 based on voltage values acquired from the monitoring circuits 11. When the voltage value of a battery unit 10 has declined due to the leak current of a monitoring circuit 11, there is a feature that the voltage value declines due to consumption of electric power even if the battery unit 10 is performing neither charge nor discharge. For this reason, the determination unit 13 acquires a voltage decreased amount of the low-voltage battery unit from the detecting unit 12.

In the operation of Step S202, the detecting unit 12 may detect a voltage decreased amount of each battery unit 10 detected as a low-voltage battery unit within a predetermined period. Alternatively, the detecting unit 12 may detect a voltage decreased amount of no smaller than two battery units 10 that are associated with a monitoring circuit having been determined that the proportions calculated in Step S102 of FIG. 4 are larger than the first threshold value. In the case of the latter, the voltage decreased amount of another battery unit (desirably, a high voltage battery unit which has the highest voltage value) may be acquired further. The determination unit 13 acquires the voltage decreased amounts which the detecting unit 12 has detected as mentioned above.

Here, generally, in a power storage system including a plurality of battery units 10, when a voltage difference among the battery units 10 becomes large, a corrective action (balance operation) to make the voltage difference be small is performed. If a voltage difference between the battery units 10 is within a predetermined voltage difference, the balance operation can perform correction in such a way that a voltage difference becomes small. However, when a voltage difference between the battery units 10 exceeds the predetermined voltage difference, the balance operation cannot reduce the voltage difference, and, therefore, every time a battery charging and discharging operation is performed, the voltage difference becomes large. The predetermined voltage is a voltage that is set according to the capability of a balance circuit that performs a balance operation, and it is changed according to the kind of the balance circuit and a method of the balance operation.

Description will be returned to FIG. 6. The determination unit 13 determines whether a voltage decreased amount is equal to or more than a second threshold value (Step S203). When the voltage decreased amount is equal to or more than the second threshold value, the determination unit 13 determines that the leak current of a specific monitoring circuit 11 is equal to or more than the second reference, and the leak current is substantially larger than the first reference (the level "large") (Step S204). When the voltage decreased amount is smaller than the second threshold value in Step S203, the determination unit 13 determines that the leak current of the specific monitoring circuit 11 is smaller than the second reference and the degree of leak of this monitoring circuit 11 is small although the leak current is larger than the first reference (the level "small") (Step S205).

According to the second example embodiment of the present invention, the magnitude of a leak current of the monitoring circuits 11 can be determined using a voltage decreased amount in the standby state of a low-voltage battery unit in addition to a proportion of each monitoring circuit 11 having been associated with low-voltage battery units. A voltage decreased amount in the standby state of a low-voltage battery unit will be a numerical value corresponding to the magnitude of a leak current of a monitoring circuit 11, and, therefore, determination accuracy of a monitoring circuit 11 having a large leak current can be improved using a voltage decreased amount in the standby state of a low-voltage battery unit. In addition, by using information on a voltage decreased amount, it is possible to further determine whether the level of the magnitude is large or small about the magnitude of the leak current of a monitoring circuit 11 that has been determined to be larger than a reference. In this example embodiment, it becomes possible to determine whether the leak current is in a range that can be corrected by a balance operation by adjusting the numerical value of the second threshold value. In this example embodiment, correction by a balance operation is possible when having been determined to be the level "small" (the range within which correction is possible by the balance operation), and, therefore, it can be determined that replacement of the monitoring circuits 11 at that time is unnecessary. On the other hand, when having been determined to be the level "large" (outside a range within which correction is possible by the balance operation), correction by the balance operation is not possible, and thus it can be determined that replacement of the monitoring circuit 11 is necessary.

Although, in the example of FIG. 6, a voltage decreased amount in the standby state of a low-voltage battery unit is used in order to determine whether a leak current is equal to or more than a reference by comparing the magnitude of values between the leak current and the second threshold value, the present invention is not limited to this example. A voltage decreased amount in the standby state of a low-voltage battery unit may be employed as a numerical value which indicates the magnitude of a leak current. For example, the difference between a voltage decreased amount in the standby state of a high voltage battery unit and a voltage decreased amount in the standby state of a low-voltage battery unit can be employed as a numerical value which indicates the magnitude of a leak current.

Also in Step S203, the determination unit 13 can use a voltage decreased amount of no smaller than two battery units which have been associated with a monitoring circuit 11 having determined that the proportion calculated in Step S102 is no smaller than the first threshold value (hereinafter, such voltage decreased amount is referred to as a first voltage decreased amount). In this case, the determination unit 13 may determine whether the level is large or small by comparing the first voltage decreased amount with a voltage decreased amount of battery units 10 associated with the other monitoring circuits 11. Furthermore, as the first voltage decreased amount, a mean value of voltage decreased amounts of no smaller than two battery units, or the voltage decreased amount of the largest numerical value among the voltage decreased amounts may be used.

The Third Example Embodiment

Figure 7:
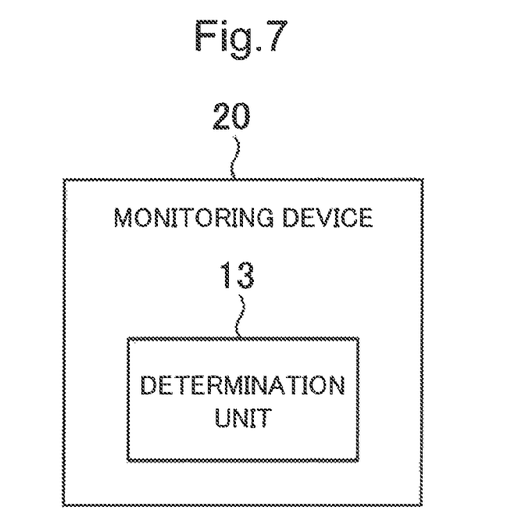
FIG. 7 is a diagram illustrating a functional configuration of a monitoring device 20 according to a third example embodiment of the present invention.

FIG. 7 is a diagram illustrating a functional configuration of the monitoring device 20 according to the third example embodiment of the present invention. The monitoring device 20 has the determination unit 13. The determination unit 13 compares a proportion of a specific monitoring circuit, among a plurality of monitoring circuits, having been associated with low-voltage battery units having the lowest voltage values among a plurality of battery units with a first predetermined threshold value. Here, a monitoring circuit is driven using electric power which has been stored in battery units associated as a monitoring target. The determination unit 13 determines whether the leak current of a specific monitoring circuit is equal to or more than a predetermined first reference using the comparison result and information which indicates whether the number of low-voltage battery units associated with the specific monitoring circuit is no smaller than 2.

Figure 8:
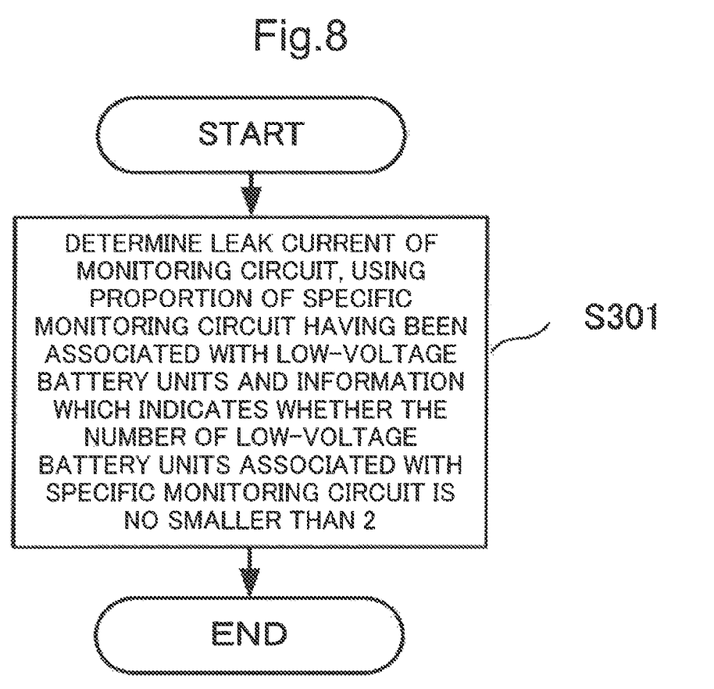
FIG. 8 is a flow chart illustrating an example of operations of the determination unit 13 of the monitoring device 20 according to the third example embodiment of the present invention.

FIG. 8 is a flow chart illustrating an example of an operation of the determination unit 13 of the monitoring device 20 according to the third example embodiment of the present invention. The determination unit 13 determines whether the leak current of a monitoring circuit is equal to or more than a predetermined first reference using a proportion of a specific monitoring circuit having been associated with low-voltage battery units and information which indicates whether the number of low-voltage battery units associated with the specific monitoring circuit is no smaller than 2 (Step S301).

Hardware Exemplary Configuration

The monitoring system 100 of the present invention having described using the first to third example embodiments can be applied to various power storage systems that include battery units. For example, this monitoring system 100 is applicable to a power storage system that include a battery for storing electric power to be used in each home.

Figure 9:
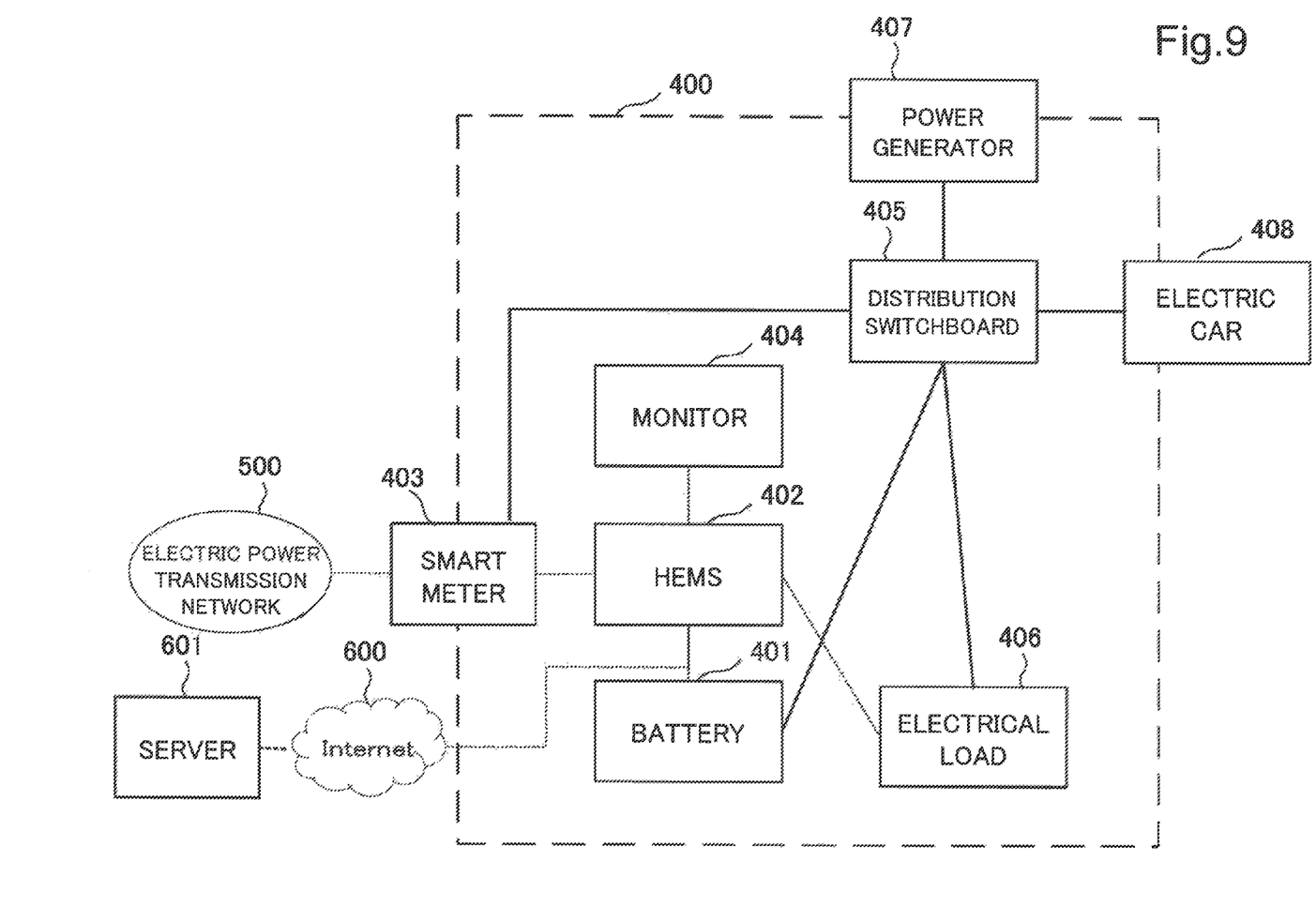
FIG. 9 is a block diagram illustrating an example of a hardware configuration of a power storage system 400 to which a monitoring system according to the first to third example embodiment of the present invention can be applied.

FIG. 9 is a block diagram illustrating an example of a hardware configuration of the power storage system 400 to which a monitoring system according to the first to third example embodiments of the present invention can be applied.

The power storage system 400 includes a battery 401, a HEMS (Home Energy Management System) 402 and a smart meter 403, a monitor 404, a distribution switchboard 405, an electrical load 406, a power generator 407, and an electric car 408. The power storage system 400 is connected to the Internet 600 and an electric power transmission network 500 possessed by a power company, respectively.

The battery 401 includes a secondary battery capable of being repeatedly charged and discharged such as a battery cell and the like. The battery 401 can store electricity generated by the power generator 407 and electricity supplied from the commercial power supply which is not illustrated, and can supply stored electricity to the electrical load 406.

The HEMS 402 is a control apparatus which grasps a usage condition of energy, and performs control and management so as to enable the power storage system 400 to be operated efficiently as a whole. The HEMS 402 can be connected to a server 601 on the Internet 600, for example, can report a usage condition of the energy in the power storage system 400 to the server 601, and operate following directions from the server 601. The HEMS 402 is connected to the battery 401 and the electrical load 406 by communication paths, and can control operations of the battery 401 and the electrical load 406. Using the monitor 404, the HEMS 402 can notify of a usage condition of the energy in the power storage system 400 and abnormality occurring in the power storage system 400.

The battery 401, the smart meter 403, the electrical load 406, the power generator 407, the electric car 408 and the like are connected via the distribution switchboard 405. As a result, electricity sent from the electric power transmission network 500 via the smart meter 403 and electricity generated by the power generator 407 is supplied to the electrical load 406 or to the battery 401, and electricity stored in the battery 401 and the electric car 408 is supplied to the electrical load 406, and so on.

The smart meter 403 is an electric power meter having a communication function, and, by connecting the smart meter 403 to the HEMS 402, a usage condition of the electricity can be grasped in the power storage system 400 and in the power company.

The monitor 404 is connected to the HEMS 402, and is an example of an output device that outputs information about the power storage system 400 such as a usage condition of electricity and the like. The monitor 404 may be a dedicated monitor of the power storage system 400 and may be equipment such as a personal computer (PC), a television receiver, a smart phone, a tablet terminal and the like.

The electrical load 406 is equipment which consumes electric power within the power storage system 400, and is a TV receiver, a PC, an air conditioner, lighting equipment and the like, for example.

The power generator 407 is a photovoltaic power generation apparatus, for example, and generates electricity from an energy source such as sunlight and the like. Electricity generated in the power generator 407 is stored in the battery 401 and the electric car 408, or sold to a power company.

The electric car 408 is a car equipped with a battery cell, and can be used as a battery cell by being connected to the power storage system 400. The electric car 408 can supply stored electricity to the electrical load 406 at the time when a consumption amount of electricity is large or at the time of a blackout.

(Corresponding Relationship Between Functional Configuration and Hardware Configuration of Monitoring System)

An example of a corresponding relationship between the functional configuration of the monitoring system 100 illustrated in FIG. 1 and the hardware configuration illustrated in FIG. 9 will be described. When the monitoring system 100 illustrated in FIG. 1 is applied to the power storage system 400 of FIG. 9, the battery units 10 are secondary batteries included in the battery 401 and the electric car 408, for example. When the battery units 10 is secondary batteries included in the battery 401, the monitoring circuits 11, the detecting unit 12 and the determination unit 13 can be achieved as components in the battery 401, for example. Alternatively, the detecting unit 12 and the determination unit 13 may be achieved as a function of the HEMS 402 and the smart meter 403. Or, the detecting unit 12 and the determination unit 13 may be included in the server 601 on the Internet 600.

Or, it is possible to provide the monitoring system 100 as a function of the electric car 408. The electric car 408 can include the functions of the battery units 10, the monitoring circuits 11, the detecting unit 12, and the determination unit 13.

Although the present invention has been described with reference to the example embodiments above, the present invention is not limited to the above-mentioned example embodiments. Various changes which a person skilled in the art can understand can be performed in the composition and details of the present invention within the scope of the technical idea of the present invention.

For example, the order of carrying out each step of the flow charts indicated in the above-mentioned example embodiments does not need to be the described order necessarily. As far as there is no description in particular, it is possible to make various alterations which a person skilled in the art can conceive of.

Although a power storage system in the home has been cited as an example of a power storage system to which a monitoring system of the above-mentioned example embodiments can be applied, the present invention is not limited to such example. It is possible to apply a monitoring system of the above-mentioned example embodiments to various power storage systems that use the battery units 10. At that time, each function of the monitoring system 100 may be achieved by one device or it may be achieved by a plurality of devices. It is possible to make various alterations about the hardware configuration thereof.

Part or all of the above-mentioned example embodiments can also be described like, but not limited to, the following supplementary notes.

(Supplementary Note 1)

A monitoring device, including a determination unit to determine whether a leak current of a specific monitoring circuit among a plurality of monitoring circuits driven using electric power stored in two or more battery units associated as a monitoring target is equal to or more than a first reference using: a comparison result of comparison between a proportion of the specific monitoring circuit being associated with a low-voltage battery unit having a lowest voltage value among the plurality of battery units in a predetermined period and a predetermined threshold value; and information indicating whether a number of low-voltage battery units associated with the specific monitoring circuit is two or more.

(Supplementary Note 2)

The monitoring device according to supplementary note 1, wherein the determination unit uses the threshold value different according to a length of the predetermined period.

(Supplementary Note 3)

The monitoring device according to supplementary note 2, wherein the shorter the predetermined period is, the larger the threshold value used by the determination unit is.

(Supplementary Note 4)

The monitoring device according to any one of supplementary notes 1 to 3, wherein
the predetermined period is a period selected from the group consisting of charge, discharge, and charge and discharge of the battery units.

(Supplementary Note 5)

The monitoring device according to any one of supplementary notes 1 to 4, wherein
the predetermined period is a period during which the battery units are being charged.

(Supplementary Note 6)

The monitoring device according to any one of supplementary notes 1 to 5, wherein
the determination means determines whether a leak current of the specific monitoring circuit is equal to or more than a second reference further using a decreased amount of a voltage value of the low-voltage battery unit in a waiting period during which the low-voltage battery unit is not being charged and discharged.

(Supplementary Note 7)

A monitoring system, including:
a plurality of battery units capable of being charged and discharged;
a plurality of monitoring circuits, driven using electric power stored in two or more battery units associated as a monitoring target among the plurality of battery units, to monitor voltage values of the associated battery units;
a detection unit to detect a low-voltage battery unit having a lowest voltage value among the plurality of battery units; and
a determination unit to determine whether a leak current of a specific monitoring circuit among the plurality of monitoring circuits is equal to or more than a first reference using: a comparison result of comparison between a proportion of the specific monitoring circuit being associated with a battery unit detected as the low-voltage battery unit in a predetermined period and a first threshold value; and information indicating whether a number of low-voltage battery units associated with the specific monitoring circuit is two or more.

(Supplementary Note 8)

A monitoring method in a monitoring system including a plurality of battery units capable of being charged and discharged, and a plurality of monitoring means, driven using electric power stored in two or more battery units associated as a monitoring target among the plurality of battery units, for monitoring voltage values of the associated battery units, the monitoring method including:
acquiring information on a low-voltage battery unit having a lowest voltage value among the plurality of battery units;
in a predetermined period, calculating a proportion of a specific monitoring circuit, among the plurality of monitoring circuits, being associated with a battery unit having been detected as the low-voltage battery unit; and
determining whether a leak current of the specific monitoring circuit is equal to or more than a first reference using a comparison result between the proportion and a predetermined threshold value and information indicating whether or not a number of low-voltage battery units associated with the specific monitoring circuit is two or more.

This application is based upon and claims the benefit of priority from Japanese Patent Application No. 2016-57587, filed on Mar. 22, 2016, the disclosure of which is incorporated herein in its entirety by reference.

REFERENCE SIGNS LIST

10 Battery unit
11 Monitoring circuit
12 Detecting unit
13 Determination unit
20 Monitoring device
100 Monitoring system

The invention claimed is:

1. A monitoring device, comprising
a determination circuit configured to determine whether a leak current of a specific monitoring circuit among a plurality of monitoring circuits driven using electric power stored in two or more battery units associated as a monitoring target among a plurality of battery units is equal to or more than a first reference using:
a comparison result of a comparison between a proportion of the specific monitoring circuit being associated with a low-voltage battery unit having a lowest voltage value among the plurality of battery units in a predetermined period and a predetermined threshold value; and
information indicating whether a number of low-voltage battery units associated with the specific monitoring circuit is two or more,
wherein the determination circuit is configured to
acquire the information at a plurality of predetermined timings in the predetermined period, and
calculate, at each of the plurality of predetermined timings, the proportion of each of the plurality of monitoring circuits associated with the low voltage battery unit.

2. The monitoring device according to claim 1, wherein the determination circuit uses different values for the threshold value according to a length of the predetermined period.

3. The monitoring device according to claim 2, wherein the shorter the predetermined period is, the larger the threshold value used by the determination circuit is.

4. The monitoring device according to claim 1, wherein the predetermined period is a period selected from the group consisting of charge, discharge, and charge and discharge of the plurality of battery units.

5. The monitoring device according to claim 1, wherein the predetermined period is a period during which the plurality of battery units are being charged.

6. The monitoring device according to claim 1, wherein the determination circuit determines whether the leak current of the specific monitoring circuit is equal to or more than a second reference further using a decreased amount of a voltage value of the low-voltage battery unit in a waiting period during which the low-voltage battery unit is not being charged and discharged.

7. A monitoring system, comprising:
a plurality of battery units capable of being charged and discharged;

a plurality of monitoring circuits configured to be driven using electric power stored in two or more battery units associated as a monitoring target among the plurality of battery units, the plurality of monitoring circuits configured to monitor voltage values of the associated battery units;

a detection circuit configured to detect a low-voltage battery unit having a lowest voltage value among the plurality of battery units; and a determination circuit configured to determine whether a leak current of a specific monitoring circuit among the plurality of monitoring circuits is equal to or more than a first reference using: a comparison result of a comparison between a proportion of the specific monitoring circuit being associated with a battery unit detected as the low-voltage battery unit in a predetermined period and a first threshold value; and information indicating whether a number of low-voltage battery units associated with the specific monitoring circuit is two or more, wherein the determination circuit is configured to acquire the information at a plurality of predetermined timings in the predetermined period, and calculate, at each of the plurality of predetermined timings, the proportion of each of the plurality of monitoring circuits associated with the low voltage battery unit.

8. A monitoring method in a monitoring system including a plurality of battery units capable of being charged and discharged, and a plurality of monitoring circuits, driven using electric power stored in two or more battery units associated as a monitoring target among the plurality of battery units, for monitoring voltage values of the associated battery units, the monitoring method comprising:

acquiring, at a plurality of predetermined timings in a predetermined period, information on a low-voltage battery unit having a lowest voltage value among the plurality of battery units;

calculating, at each of the plurality of predetermined timings, a proportion of a specific monitoring circuit, among the plurality of monitoring circuits, being associated with a battery unit having been detected as the low-voltage battery unit; and determining whether a leak current of the specific monitoring circuit is equal to or more than a first reference using a comparison result between the proportion and a predetermined threshold value and information indicating whether or not a number of low-voltage battery units associated with the specific monitoring circuit is two or more.

\* \* \* \* \*